US008022764B2

(12) United States Patent
Saigusa (10) Patent No.: US 8,022,764 B2
(45) Date of Patent: Sep. 20, 2011

(54) DIFFERENTIAL AMPLIFIER

(75) Inventor: Shigehito Saigusa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 9 days.

(21) Appl. No.: 12/715,566

(22) Filed: Mar. 2, 2010

(65) Prior Publication Data

US 2010/0244961 A1  Sep. 30, 2010

(30) Foreign Application Priority Data

Mar. 27, 2009  (JP) ................. 2009-080061

(51) Int. Cl.
   *H03F 3/45*  (2006.01)
(52) U.S. Cl. ..................... 330/260; 330/258
(58) Field of Classification Search .......... 330/253, 330/258, 260
   See application file for complete search history.

(56) References Cited

U.S. PATENT DOCUMENTS 6,624,698 B2 * 9/2003 Nagaraj ................ 330/258
7,443,237 B1 * 10/2008 Liu ...................... 330/260

FOREIGN PATENT DOCUMENTS

JP   2000-278053   10/2000

OTHER PUBLICATIONS

Behbahani, et al. A Fully Integrated Low-IF CMOS GPS Radio With On-Chip Analog Image Rejection, IEEE Journal of Solid-State Circuits, vol. 37, No. 12, pp. 1721-1727, Dec. 2002.
Lee, et al. A Wideband CMOS Variable Gain Amplifier With an Exponential Gain Control, IEEE Transactions on Microwave Theory and Techniques, vol. 55, No. 6, pp. 1363-1373, Jun. 2007.
Arai, et al. A Baseband Gain-Controlled Amplifier with a Linear-in-dB Gain Range from 14dB to 76dB and a Fixed Corner Frequency DC Offset Canceler, ISSCC Digital Technical Papers, pp. 136-137, Feb. 2003.
Grafe, et al. A Wide Range dB-linear Variable Gain CMOS Amplifier, pp. 48-51, 1997.

* cited by examiner

*Primary Examiner* — Khanh V Nguyen
(74) *Attorney, Agent, or Firm* — Turocy & Watson, LLP (57) ABSTRACT

A differential amplifier unit and a feedback unit are provided. The differential amplifier unit includes first and second transistors and first to fourth loads. Each of the first and second transistors is provided with a current input end, a current output end connected to a lower potential power source and a control end. The first and second loads are cascade connected between a higher potential power source and the current input end of the first transistor. The third and fourth loads are cascade connected between the higher potential power source and the current input end of the second transistor. The feedback unit generates first and second feedback currents based on first and second output voltages. The feedback unit inputs the first and second feedback currents to a third node connecting the first and second loads and a fourth node connecting the third and fourth loads.

20 Claims, 10 Drawing Sheets

DIFFERENTIAL AMPLIFIER

CROSS-REFERENCE TO RELATED APPLICATION

This application is based upon and claims the benefit of priority from the prior Japanese Patent Application No. 2009-80061, filed on Mar. 27, 2009; the entire contents of which are incorporated herein by reference.

FIELD OF THE INVENTION

The invention relates to a differential amplifier.

DESCRIPTION OF THE BACKGROUND

Differential amplifiers, such as amplifiers or comparators, are widely used to amplify inputted signals and to output amplified signals. The differential amplifiers are employed in an input and output units of electronic appliances for consumer use or communication use. A differential amplifier is disclosed in Japanese Patent Application Publication JP2000-278053 (page 9, FIG. 10). Recently, with development of miniaturization of a semiconductor device, speeding up of a semiconductor integrated circuit has advanced. High speed operation is also required for amplifiers and comparators having a differential amplifier composed of a semiconductor integrated circuit respectively.

In order to achieve higher speed operation, gate lengths of a semiconductor device such as a MOS transistor composing a differential amplifier are formed shorter. In the case, shortening gate lengths causes a problem that a DC offset voltage of a differential amplifier circuit increases due to variations in gate length or in threshold voltage, which arises due to fluctuation of the process condition in manufacturing MOS transistors. In addition, when a feedback voltage is inputted to the differential amplifier circuit to reduce the DC offset voltage, inputting feedback voltage caused a problem that input and output impedance of the differential amplifier circuit can not be large.

SUMMARY OF THE INVENTION

An aspect of the present invention provides a differential amplifier, comprising a differential amplifier unit and a feedback unit to supply a feedback current to the differential amplifier unit, the differential amplifier unit, which includes first and second transistors composing a differential pair, each of the first and second transistors being provided with a current input end, a current output end connected to a lower potential power source and a control end, first and second loads which are cascade connected between a higher potential power source and the current input end of the first transistor, and third and fourth loads which are cascade connected between the higher potential power source and the current input end of the second transistor, wherein the feedback unit generates first and second feedback currents based on first and second output voltages obtained from a first node connecting the first transistor and the second load and a second node connecting the second transistor and the fourth load, and the feedback unit inputs the first and second feedback currents to a third node connecting the first and second loads and a fourth node connecting the third and fourth loads, respectively.

An aspect of the present invention provides a differential amplifier, comprising a differential amplifier unit and a feedback unit to supply a feedback current to the differential amplifier unit, the differential amplifier unit, which including first and second transistors composing a differential pair, each of the first and second transistors being provided with a source connected to a lower potential power source, a drain and a gate, a third transistor having a source connected to a higher potential power source, a fifth transistor having a source connected to the higher potential power source, a fourth transistor connected between a drain of the third transistor and the drain of the first transistor, a sixth transistor connected between a drain of the fifth transistor and the drain of the second transistor, a first resistor having two ends, one of the ends being connected to a first node connecting the first transistor and the fourth transistor and the other of the ends being connected to control ends of the third, fourth, fifth and sixth transistors, and a second resistor having two ends, one of the ends being connected to a second node connecting the second transistor and the sixth transistor and an other of the ends being connected to the control ends of the third, fourth, fifth and sixth transistors, wherein the feedback unit generates first and second feedback currents based on first and second output voltages obtained from the first and second nodes, and the feedback unit inputs the first and second feedback currents to a third node connecting the third and fourth transistors and a fourth node connecting the fifth and sixth transistors, respectively.

An aspect of the present invention provides a differential amplifier, comprising a differential amplifier unit and a feedback unit to supply a feedback current to the differential amplifier unit, the differential amplifier unit, which includes first and second transistors composing a differential pair, each of the first and second transistors being provided with a source connected to a lower potential power source, a drain and a gate, a first resistor having an end connected to a higher potential power source, a second resistor having an end connected to the higher potential power source, a third transistor connected between the other end of the first resistor and the drain of the first transistor, a fourth transistor connected between the other end of the second resistor and the drain of the second transistor, a third resistor having two ends, one of the ends being connected to a first node connecting the first transistor and the third transistor and the other of the ends being connected to control ends of the third and fourth transistors, and a fourth resistor having two ends, one of the ends being connected to a second node connecting the second transistor and the fourth transistor and the other of the ends being connected to the control ends of the third and fourth transistors, wherein the feedback unit generates first and second feedback currents based on first and second output voltages obtained from the first and second nodes, and the feedback unit inputs the first and second feedback currents to a third node connecting the third transistor and the first resistor and a fourth node connecting the fourth transistor and the second resistor.

DETAILED DESCRIPTION OF THE INVENTION

Hereinafter, embodiments of the invention will be described with reference to the drawings. In the drawings, the same or similar reference numerals designate the same or similar portions, respectively.

Figure 1:
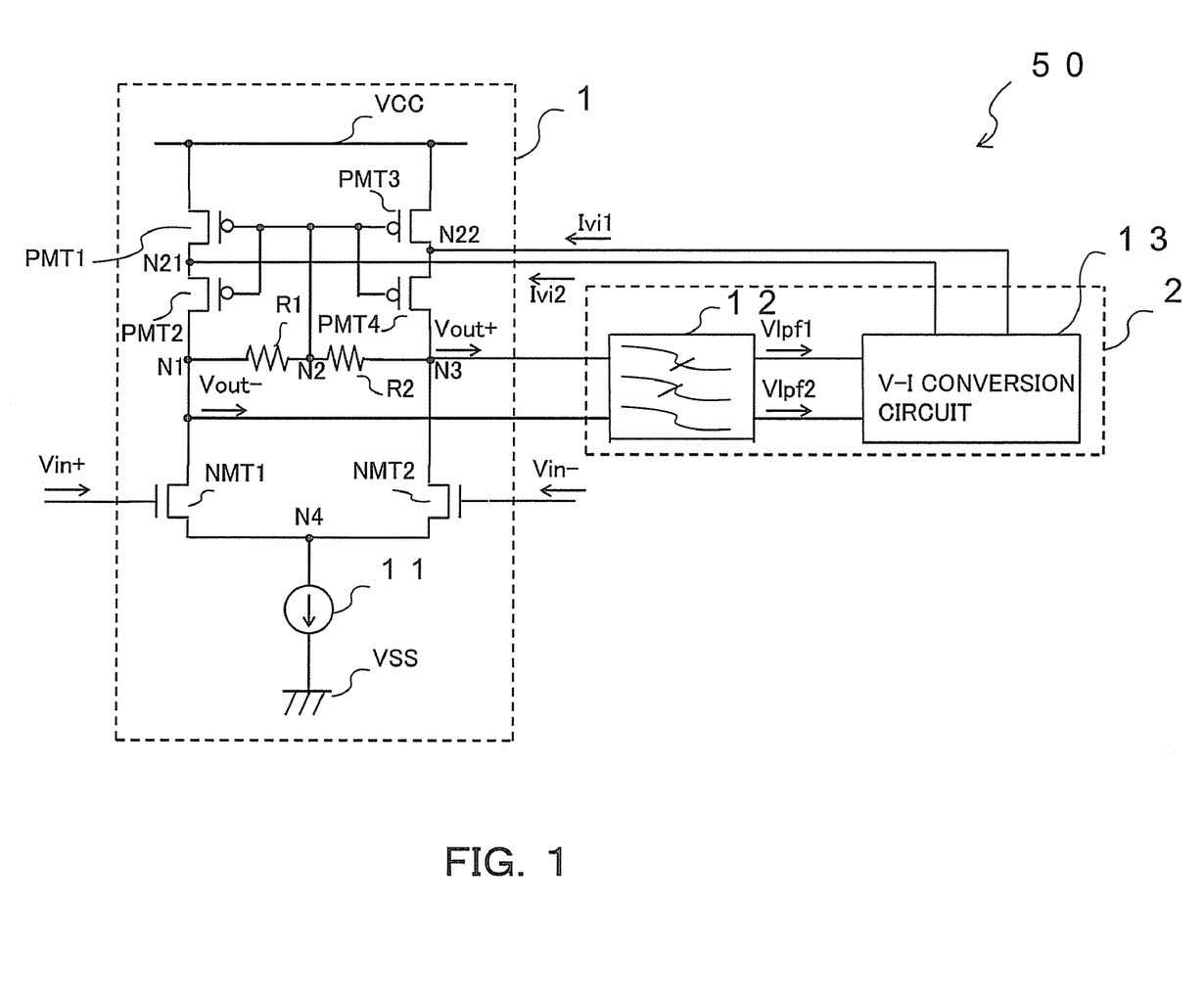
FIG. 1 is a circuit diagram showing a structure of a differential amplifier according to a first embodiment of the invention.

A differential amplifier according to a first embodiment of the invention will be described with reference to FIG. 1. FIG. 1 is a circuit diagram showing a structure of a differential amplifier according to a first embodiment.

In the embodiment, first and second feedback currents, which are obtained by voltage-to-current conversion of first and second output voltages of a differential amplifier respectively, are inputted to output sides of the differential amplifier.

As shown in FIG. 1, a differential amplifier 50 is provided with a differential amplifier unit 1 and a feedback unit 2. The differential amplifier 50 is so constructed as to reduce DC offset which is generated in the differential amplifier unit 1, as described below. The differential amplifier 50 is a current feedback type amplifier and is applied to an A/D converter or IF band amplifier.

The differential amplifier unit 1 is provided with a current source 11, N-channel MOS transistors NMT1, NMT2, P-channel MOS transistors PMT1 to PMT4 and resistors R1, R2.

The MOS transistors NMT1, NMT2 and PMT1-PMT4 are MOSFETs (Metal Oxide Semiconductor Field Effect Transistors).

A plus side input voltage Vin+ and a minus side input voltage Vin− with an inverse phase of the plus side input voltage Vin+ are inputted to gates of the N-channel MOS transistors NMT1, NMT2, respectively. A plus side output voltage Vout+ and a minus side output voltage Vout− differentially amplified in the differential amplifier unit 1 are outputted to the feedback unit 2 and to the outside. Feedback currents Ivi1 and Ivi2 voltage-to-current converted in the feedback unit 2 are supplied to nodes N22, N21.

A source of the P-channel MOS transistor PMT1 is connected to a higher potential power source VCC. A gate of the P-channel MOS transistor PMT1 is connected to a node N2. A drain of the P-channel MOS transistor PMT1 is connected to the node N21.

A source of the P-channel MOS transistor PMT2 is connected to the drain of the P-channel MOS transistor PMT1 or the node N21. A gate of the P-channel MOS transistor PMT2 is connected to the gate of the P-channel MOS transistor PMT1 and the node N2. A drain of the P-channel MOS transistor PMT2 is connected to a node N1. The P-channel MOS transistors PMT1 and PMT2 are cascode connected.

A source of the P-channel MOS transistor PMT3 is connected to the higher potential power source VCC. A gate of the P-channel MOS transistor PMT3 is connected to the node N2. A drain of the P-channel MOS transistor PMT3 is connected to the node N22.

A source of the P-channel MOS transistor PMT4 is connected to the drain of the P-channel MOS transistor PMT3 or the node N22. A gate of the P-channel MOS transistor PMT4 is connected to the gate of the P-channel MOS transistor PMT3 and the node N2. A drain of the P-channel MOS transistor PMT4 is connected to a node N3. The P-channel MOS transistors PMT3 and PMT4 are cascode connected.

The P-channel MOS transistors PMT1 through PMT4 function as loads. The cascode connected P-channel MOS transistors PMT1 and PMT2 and the cascode connected P-channel MOS transistors PMT3 and PMT4 can present a good current matching compared with a current mirror circuit and a resistor load.

One end of the resistor R1 is connected to the node N1. The other end of the resistor R1 is connected to the node N2. One end of the resistor R2 is connected to the node N2. The other end of the resistor R2 is connected to the node N3. The resistors R1 and R2 function as a CMFB (Common Mode Feedback) means to earth the node R2 virtually based on differential change between the node N1 and the node N3. The resistors R1 and R2 suit to lower gain applications.

A drain of the N-channel MOS transistor NMT1 is connected to the node N1. The plus side input voltage Vin+ is inputted to the gate of the N-channel MOS transistor NMT1. A source of the N-channel MOS transistor NMT1 is connected to a node N4.

A drain of the N-channel MOS transistor NMT2 is connected to the node N3. The minus side input voltage Vin− with an inverse phase of the plus side input voltage Vin+ is inputted to the gate of the N-channel MOS transistor NMT2. A source of the N-channel MOS transistor NMT2 is connected to the node N4.

The N-channel MOS transistors NMT1 and NMT2 composes a differential pair. A differentially amplified minus side output voltage Vout− is outputted from the drain side of the N-channel MOS transistors NMT1 or the node N1 side. A differentially amplified plus side output voltage Vout+ is outputted from the drain side of the N-channel MOS transistors NMT2 or the node N3 side.

One end of the current source 11 is connected to the node N4. The other end of the current source 11 is connected to a lower potential power source VSS. The current source 11 flows a bias current from the node N4 to the lower potential power source VSS side. The differential amplifier unit 1 operates according to the bias current.

The feedback unit 2 is provided with a low pass filter 12 and a voltage-to-current conversion circuit 13. The low pass filter 12 is provided between the differential amplifier unit 1 and the voltage-to-current conversion circuit 13. The plus side output voltage Vout+ and the minus side output voltage Vout−, which are outputted from the differential amplifier unit 1, are inputted to the low pass filter 12. The low pass filter 12 generates filter output voltages Vlpf1 and Vlpf2. A gm-C filter or an active RF filter is can be used as the low pass filter 12.

Figure 2A:
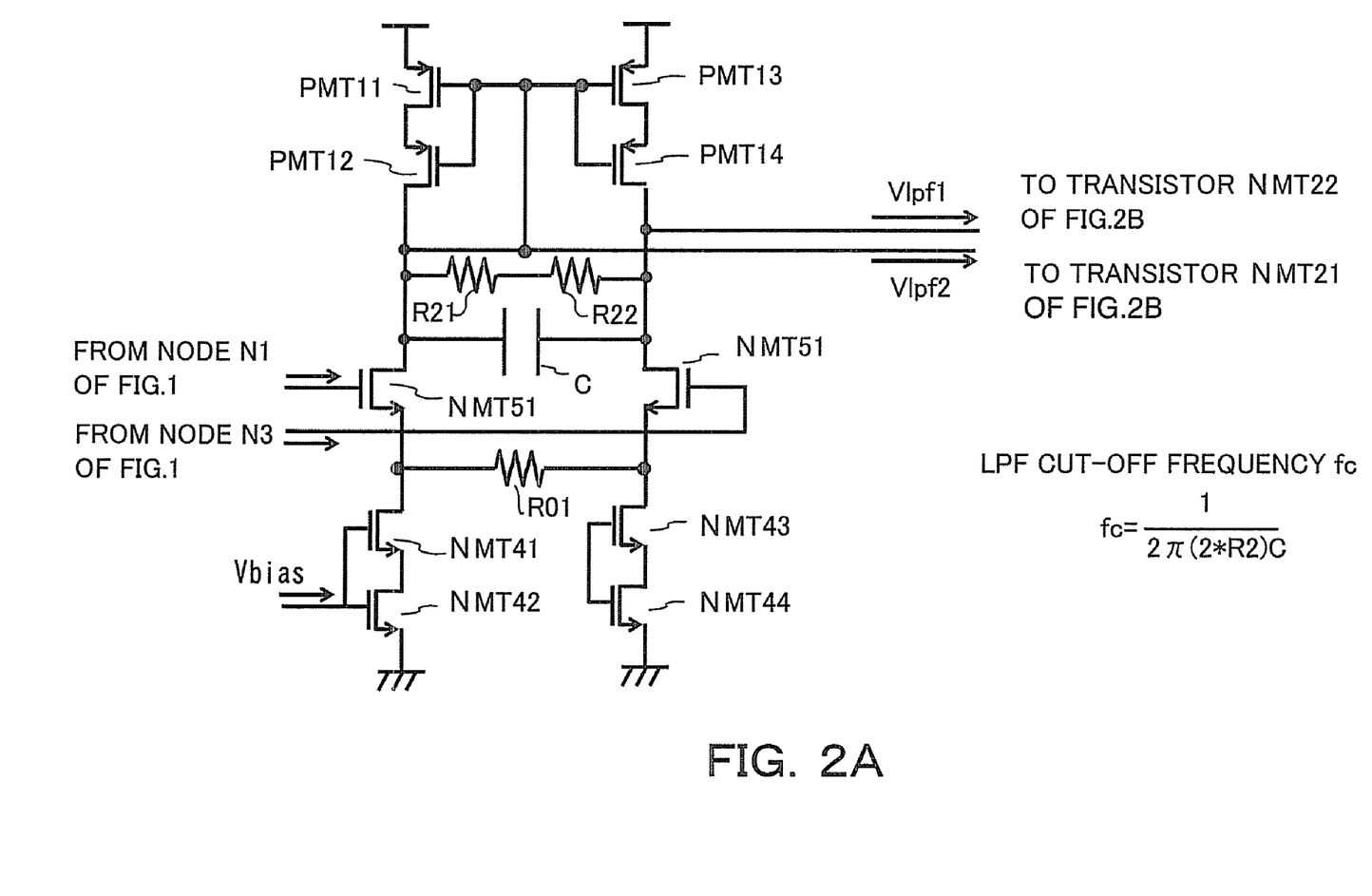
FIG. 2A is a circuit diagram showing a structure of a low pass filter.

The low pass filter 12 has a structure shown in FIG. 2A. In the low pass filter 12, N-channel MOS transistors NMT41 to NMT44, an N-channel MOS transistor NMT51, an N-channel MOS transistor NMT52, and resistance R01 are provided. A series circuit of capacity C and resistances R21, R22 is connected between a drain of the N-channel MOS transistor NMT51 and a drain of the N-channel MOS transistor NMT52.

A drain of a P-channel MOS transistor PMT12 is connected to a drain of the N-channel MOS transistor NMT51. A drain of a P-channel MOS transistor PMT11 is connected to a source of the P-channel MOS transistor PMT12. The P-channel MOS transistors PMT11, PMT12 are connected in cascode.

A drain of a P-channel MOS transistor PMT14 is connected to a drain of the N-channel MOS transistor NMT52. A drain of a P-channel MOS transistor PMT13 is connected to a sauce of the P-channel MOS transistor PMT14. The P-channel MOS transistors PMT13, PMT14 are connected in cascode.

The output voltage Vlpf1 of FIG. 1 is obtained from the drain of the P-channel MOS transistor PMT14.

The gates of P-channel MOS transistors PMT11 to PMT14 are connected to drains of the P-channel MOS transistors PMT12, PMT14. The output voltage Vlpf2 of FIG. 1 is obtained from these drains.

The output voltage Vout− from node N1 of FIG. 1 is inputted into a gate of the N-channel MOS transistor NMT51. The output voltage Vout+ from node N3 of FIG. 1 is inputted into a gate of the N-channel MOS transistor NMT52.

A bias voltage Vbias is inputted into gates of the N-channel MOS transistors NMT41, NMT42. The N-channel MOS transistors NMT41, NMT42 function as a current source. The N-channel MOS transistors NMT43, NMT44 function as another current source.

Resistances may be used instead of the N-channel MOS transistors NMT42, NMT44. The N-channel MOS transistors NMT42, NMT44 may be removed, and the removed portions may be short-circuited between the terminals respectively. Resistances may be used instead of the P-channel MOS transistors PMT11 and PMT13. The P-channel MOS transistors PMT11, PMT13 may be removed, and the removed portions may be short-circuited respectively.

The voltage-to-current conversion circuit 13 receives the low pass filter output voltages Vlpf1 and Vlpf2 outputted from the low pass filter 12, and generates the voltage-to-current converted feedback currents Ivi1 and Ivi2. The feedback current Ivi1 is inputted to the node N22 of the differential amplifier unit 1. The feedback current Ivi2 is inputted to the node N21 of the differential amplifier unit 1.

Figure 2B:
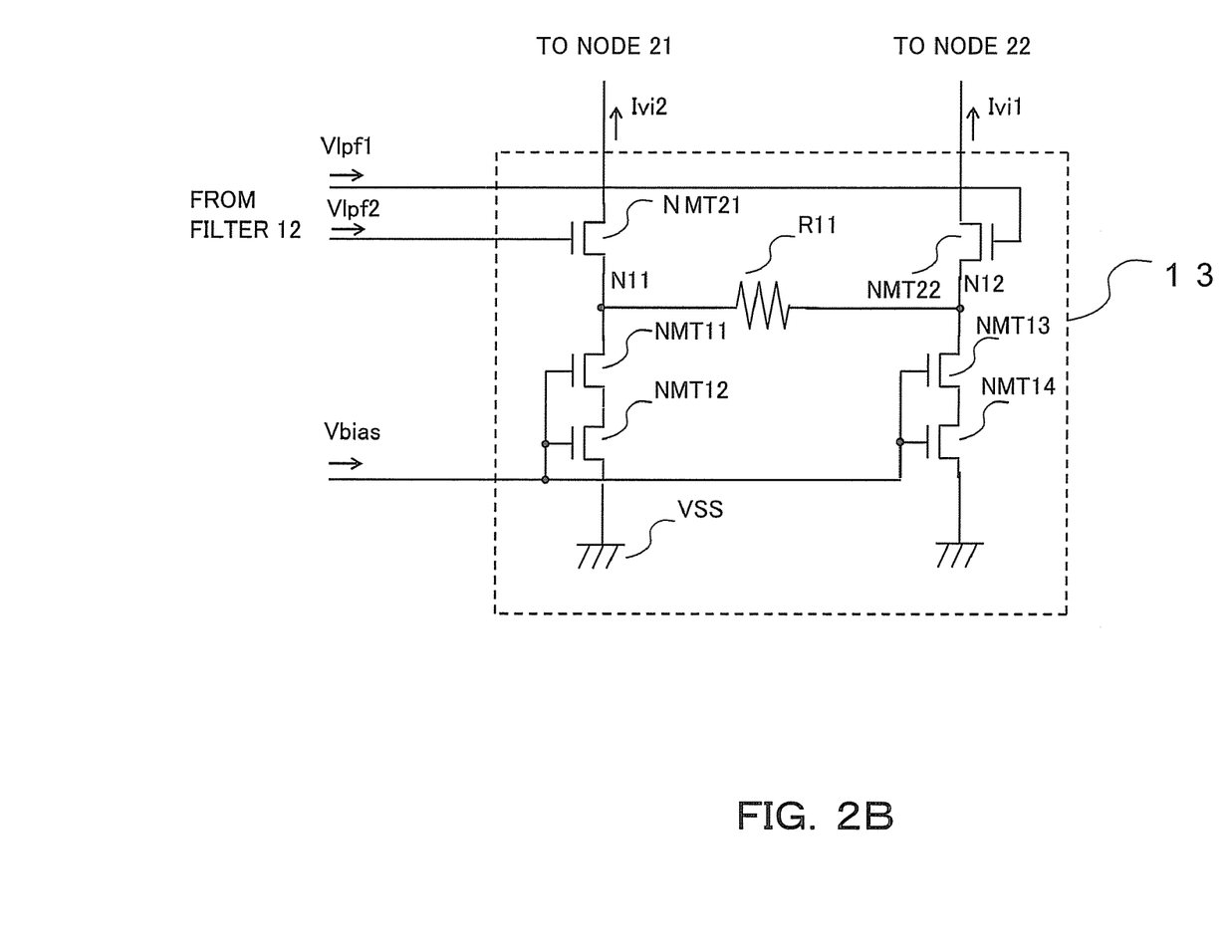
FIG. 2B is a circuit diagram showing a structure of a voltage-to-current conversion circuit.

A detailed structure of the voltage-to-current conversion circuit 13 is shown in FIG. 2B. N-channel MOS transistors NMT11 through NMT14, an N-channel MOS transistor NMT21, an N-channel MOS transistors NMT22 and a resistor R11 are provided.

A drain of the N-channel MOS transistor NMT21 is connected to the node N21 of the differential amplifier unit 1 shown in FIG. 1. The low pass filter output voltage Vlpf2 outputted from the low pass filter 12 is inputted to a gate of the N-channel MOS transistor NMT21. A source of the N-channel MOS transistor NMT21 is connected to a node N11. The feedback current Ivi2 is outputted from the drain side of the N-channel MOS transistor NMT21 to the node N21.

A drain of the N-channel MOS transistor NMT22 is connected to the node N22 of the differential amplifier unit 1 shown in FIG. 1. The low pass filter output voltage Vlpf1 outputted from the low pass filter 12 is inputted to a gate of the N-channel MOS transistor NMT22. A source of the N-channel MOS transistor NMT22 is connected to a node N12. The feedback current Ivi1 is outputted from the drain side of the N-channel MOS transistor NMT22 to the node N22.

One end of the resistor R11 is connected to the node N11. The other end of the resistor R11 is connected to the node N12. A drain of the N-channel MOS transistor NMT11 is connected to the node N11. A bias voltage Vbias is inputted to a gate of the N-channel MOS transistor NMT11. A drain of the N-channel MOS transistor NMT12 is connected to a source of the N-channel MOS transistor NMT11. The bias voltage Vbias is inputted to a gate of the N-channel MOS transistor NMT12. A source of the N-channel MOS transistor NMT12 is connected to the lower potential power source VSS.

A drain of the N-channel MOS transistor NMT13 is connected to the node N12, and the bias voltage Vbias is inputted to a gate of the N-channel MOS transistor NMT13. A drain of the N-channel MOS transistor NMT14 is connected to a source of the N-channel MOS transistor NMT13. The bias voltage Vbias is inputted to a gate of the N-channel MOS transistor NMT14. A source of the N-channel MOS transistor NMT14 is connected to the lower potential power source VSS.

The N-channel MOS transistors NMT11 and NMT12 are cascode connected and function as a current source. The N-channel MOS transistors NMT13 and NMT14 are cascode connected and function as a current source.

Resistors may be used in place of the N-channel MOS transistors NMT12 and NMT14. The N-channel MOS transistors NMT12 and NMT14 may be eliminated and their terminals may be short-circuited.

An input and output impedance of the differential amplifier 50, which is a current feedback type amplifier, can be larger compared with a voltage feedback type amplifier. As for the differential amplifier 50, a trans-impedance can be lower by one(1)+a loop gain. The loop gain is a product of a transconductance gm and an impedance $R_F$ of the feedback unit 2.

Figure 3A:
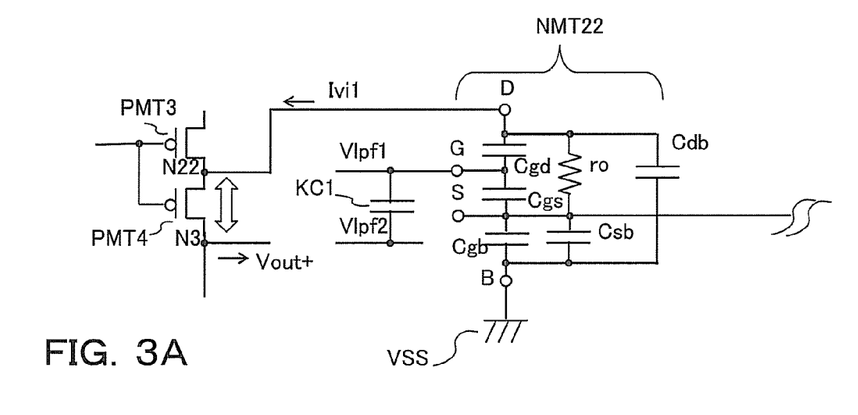
FIG. 3 is a drawing for explaining the relationship between an output impedance of a differential amplifier unit and an output impedance of a voltage-to-current conversion circuit according to the first embodiment.
Figure 3B:
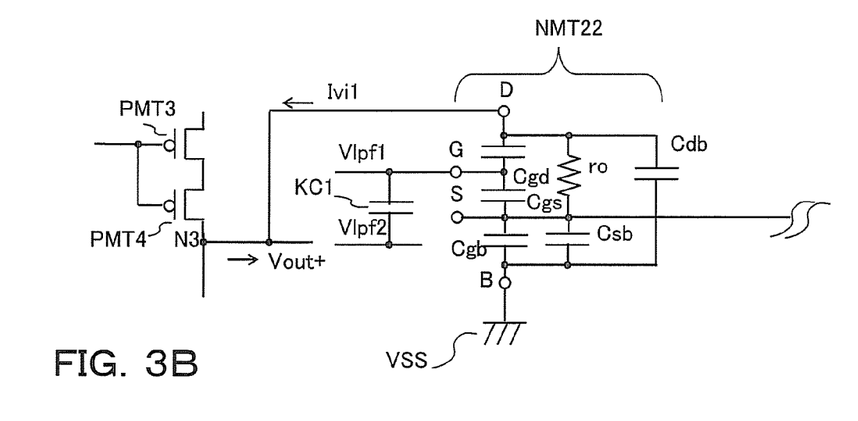

Characteristics of the differential amplifiers of the embodiment and a comparative example will be described with reference to FIGS. 3A and 3B. FIGS. 3A and 3B show a relationship between an output impedance of the differential amplifier unit 1 and an output impedance of the voltage-to-current conversion circuit 13, respectively. FIG. 3A shows the characteristic of the embodiment. FIG. 3B shows the characteristic of the comparative example.

In FIGS. 3A and 3B, the P-channel MOS transistors PMT3, PMT4 and the N-channel MOS transistor NMT22 are shown representatively. The N-channel MOS transistor NMT22 is provided with a drain D, a gate G, a source S, a terminal B of the power source VSS, a gate-drain capacitance Cgd, a gate-source capacitance Cgs, a capacitance Cgb between the gate and the power source terminal, a capacitance Csb between the source and the power source terminal, and a capacitance Cdb between the drain and the power source terminal. A parasitic capacitance KC1, which becomes a load capacitance, exists between wires to transmit the low pass filter output voltages Vlpf1, Vlpf2, respectively.

The P-channel MOS transistors PMT1, PMT1 and the N-channel MOS transistor NMT21 have configurations similar to those of the P-channel MOS transistors PMT3, PMT4 and the N-channel MOS transistor NMT22. The differential amplifier according to the comparative example is different from the differential amplifier 50 of the embodiment in that an output port of the differential amplifier unit 1 and an output port of the feedback unit 2 are the same node. Except the above-described point, the structure of the differential amplifier of the comparative example is the same as that of the differential amplifier 50 of the embodiment.

As shown in FIG. 3B, in the differential amplifier of the comparative example, the plus side output voltage Vout+ of the differential amplifier unit 1 is outputted from the node N3. The feedback current Ivi1 outputted from the drain of the N-channel MOS transistor NMT22 of the voltage-to-current conversion circuit 13 is inputted to the node N3. Similarly, the minus side output voltage Vout− of the differential amplifier unit 1 is outputted from the node N1. The feedback current Ivi2 outputted from the drain of the N-channel MOS transistor NMT21 of the voltage-to-current conversion circuit 13 is inputted to the node N1.

An output impedance of the differential amplifier of the comparative example is expressed as a parallel connection of an output impedance of the differential amplifier unit 1 and an output impedance of the voltage-to-current conversion circuit 13. Accordingly, the output impedance of the differential amplifier of the comparative example is smaller than the output impedance of the single differential amplifier unit 1. In addition, the output nodes of the differential amplifier of the comparative example are connected to the parasitic capacitance KC1, which are the capacitance between the wires to transmit the low pass filter output voltages Vlpf1, Vlpf2 respectively, via the gate-drain capacitances Cgd of the N-channel MOS transistors NMT21, NMT22 which are output transistors of the voltage-to-current conversion circuit 13.

As a result, the output impedance of the differential amplifier of the comparative example decreases by the output impedance of the voltage-to-current conversion circuit 13. The gain of the differential amplifier of the comparative example decreases, and the width of the frequency band becomes narrower. In addition, the larger the parasitic capacitance KC1 becomes, the more the gain of the differential amplifier of the comparative example decreases and the narrower the width of the frequency band becomes.

On the other hand, in the differential amplifier 50 of the embodiment, the output nodes N1, N3, which are the output ports of the differential amplifier unit 1, and the output nodes N21, N22, which are the output ports of the feedback unit 2, are not the same nodes, but are separated, respectively.

Concretely, the plus side output voltage Vout+ of the differential amplifier unit 1 is outputted from the node N3 that is the drain side of the P-channel MOS transistor PMT4. The feedback current Ivi1 outputted from the drain of the N-channel MOS transistor NMT22 of the voltage-to-current conversion circuit 13 is inputted to the node 22 that is the source side of the P-channel MOS transistor PMT4.

The minus side output voltage Vout− of the differential amplifier unit 1 is outputted from the node N1 that is the drain side of the P-channel MOS transistor PMT2. The feedback current Ivi2 outputted from the drain of the N-channel MOS transistor NMT21 of the voltage-to-current conversion circuit 13 is inputted to the node 21 that is the source side of the P-channel MOS transistor PMT2.

In the differential amplifier 50 of the embodiment, the output ports of the differential amplifier unit 1 and the output ports of the feedback unit 2 are separated. Accordingly, the effect of the output impedance of the voltage-to-current conversion circuit 13 is reduced much, and the output impedance of the differential amplifier 50 can be expressed as the output impedance of the single differential amplifier unit 1. In addition, the output nodes N1, N3 of the differential amplifier 50 of the embodiment are separated from the parasitic capacitance KC1 so that the effect of the parasitic capacitance KC1 can be reduced much.

As a result, in the differential amplifier 50 of the embodiment, decrease in gain and in width of frequency band are suppressed, and the gain and the width of frequency band can be ensured without increasing current. In addition, even if the parasitic capacitance KC1 resulting from the layout design of the wires becomes larger, sufficient gain and sufficient width of frequency band can be ensured without increasing current.

Figure 4:
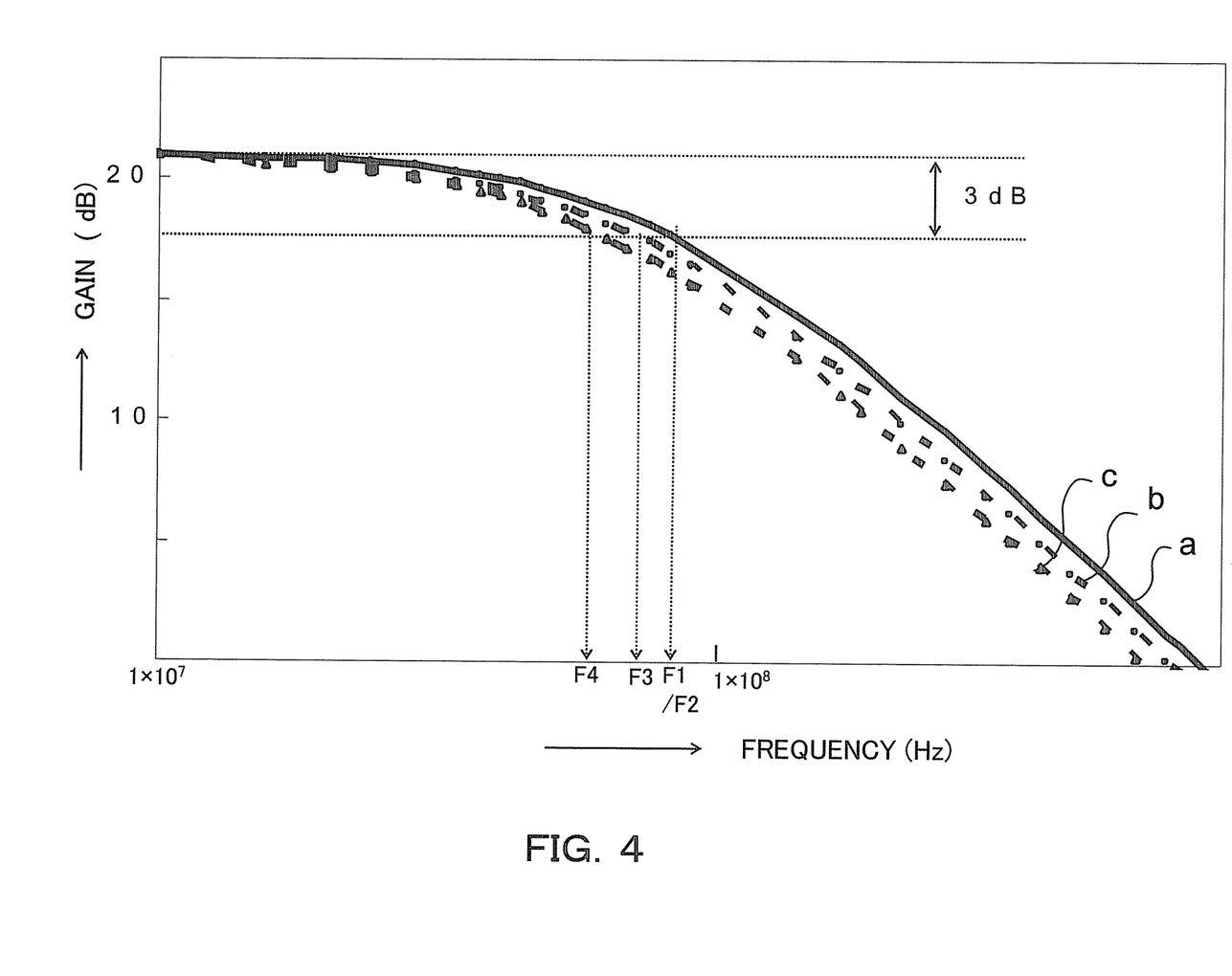
FIG. 4 is a characteristic diagram showing the relationship between a frequency and a gain of the differential amplifier unit according to the first embodiment.

FIG. 4 is a characteristic diagram showing the relationship between frequency and gain of the differential amplifiers of the embodiment and the comparative example. In FIG. 4, the solid line "a" shows a characteristic diagram of the embodiment, and the dotted lines "b" and "c" show characteristic diagrams of the comparative examples.

As shown in FIG. 4, according to the differential amplifier 50 of the embodiment, the frequency F1 is 86 MHz when the gain decreases by three dB, in the case that the parasitic capacitance KC1 is zero. In the case that the parasitic capacitance KC1 is 10 fF, for example, the frequency F2 is 84 MHz when the gain decreases by three dB. In this case, the decrease of the band width and the gain is small, compared with the case that the parasitic capacitance KC1 is zero.

On the other hand, in the differential amplifier of the comparative embodiment, the frequency F3 is 72 MHz when the gain decreases by three dB, in the case that the parasitic capacitance KC1 is zero. The band width and the gain decrease much compared with the differential amplifier 50 of the embodiment. The frequency F4 is 63 MHz when the gain decreases by three dB in the case that the parasitic capacitance KC1 is 10 fF. The band width decreases and the gain also decreases compared with the case that the parasitic capacitance KC1 is zero. In addition, the decrease of the band width is larger and the decrease of the gain is also larger compared with the differential amplifier 50 of the embodiment.

As described above, in the differential amplifier of the embodiment, the output ports of the differential amplifier unit 1 and the output ports of the feedback unit 2 are separated via the P-channel MOS transistors PMT2, PMT4.

Therefore, while reducing the DC offset voltage of the differential amplifier, the effect of the output impedance of the voltage-to-current conversion circuit 13 can be reduced greatly, and the effect of the parasitic capacitance KC1 can be reduced much. According to the embodiment, the input and output impedance can be large, the gain can be sufficient, and a sufficient frequency band width can be ensured.

The MOS transistors used in the embodiment have a gate insulating film composed of a silicon oxide film respectively. A MIS transistor (Metal Insulator Semiconductor Transistor) with a gate insulating film may be used. The gate insulating film of the MIS transistor can be composed of a SiNxOy film, which may be obtained by thermal nitrification of a silicon oxide film, a laminated film of a silicon nitride film ($Si_3N_4$) and a silicon oxide film, or a higher dielectric film (a High-K gate insulating film).

In place of the P-channel MOS transistors PMT1-PMT4 used as loads, transistors which are turned ON when a voltage is inputted to a gate, normally-on transistors, or resistors may be used.

In the embodiment, the resistors R1 and R2 are provided which function as a CMFB (Common Mode Feedback) means. The resistors R1 and R2 may be omitted, and voltages may be supplied directly to the P-channel MOS transistors PMT1, PMT3 and the P-channel MOS transistors PMT2, PMT4, respectively.

Figure 5:
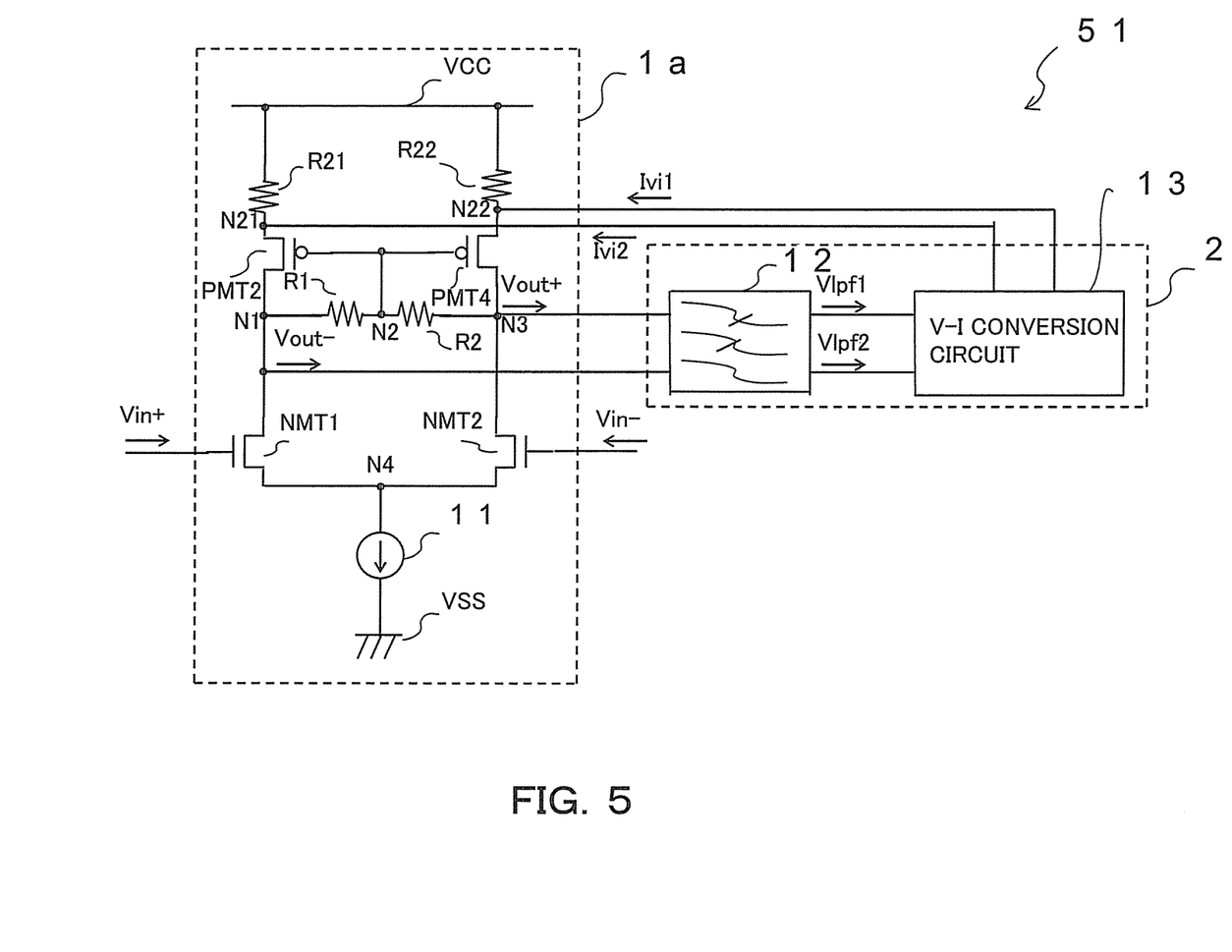
FIG. 5 is a circuit diagram showing a structure of a differential amplifier according to a second embodiment of the invention.

A differential amplifier according to a second embodiment will be described with reference to the drawings. FIG. 5 is a circuit diagram showing a structure of the differential amplifier. The embodiment is different from the first embodiment in structure of a differential amplifier unit.

As shown in FIG. 5, a differential amplifier 51 is provided with a differential amplifier unit 1a and the feedback unit 2. In the differential amplifier 51, as the current Ivi1, Ivi2 are fed back from the voltage-to-current conversion circuit 13 of the feedback unit 2 to the differential amplifier unit 1a, the DC offset, which is generated in the differential amplifier unit 1a, can be reduced.

In the embodiment, a resistor R21 is provided in place of the P-channel MOS transistor PMT1 shown in FIG. 1. Both ends of the resistor R21 are connected to the power source VCC and the P-channel MOS transistor PMT2, respectively.

In addition, in the embodiment, a resistor R22 is provided in place of the P-channel MOS transistor PMT3 shown in FIG. 1. Both ends of the resistor R22 are connected to the power source VCC and the P-channel MOS transistor PMT4, respectively.

By using the resistors R21, R22 as described above, output impedances of the P-channel MOS transistor PMT2 and PTM4 can be made larger.

The differential amplifier 51 of the embodiment operates similarly to the differential amplifier 50 of the first embodiment.

In the embodiment, the node N1, N3 which are the output ports of the differential amplifier unit 1a are separated from the node N21, N22 that are the output ports of the feedback unit 2. AS a result, the DC offset voltage can be reduced. The effect of the output impedance of the voltage-to-current conversion circuit 13 can be reduced greatly. The effect of the parasitic capacitance KC1 can be reduced much.

In the embodiment, the output impedances of the P-channel MOS transistors PMT2, PMT4 can be larger than those of the first embodiment.

Accordingly, the DC offset voltage can be reduced. The input and output impedance can be large. The gain can be sufficient. A sufficient frequency band width can be ensured.

Figure 6:
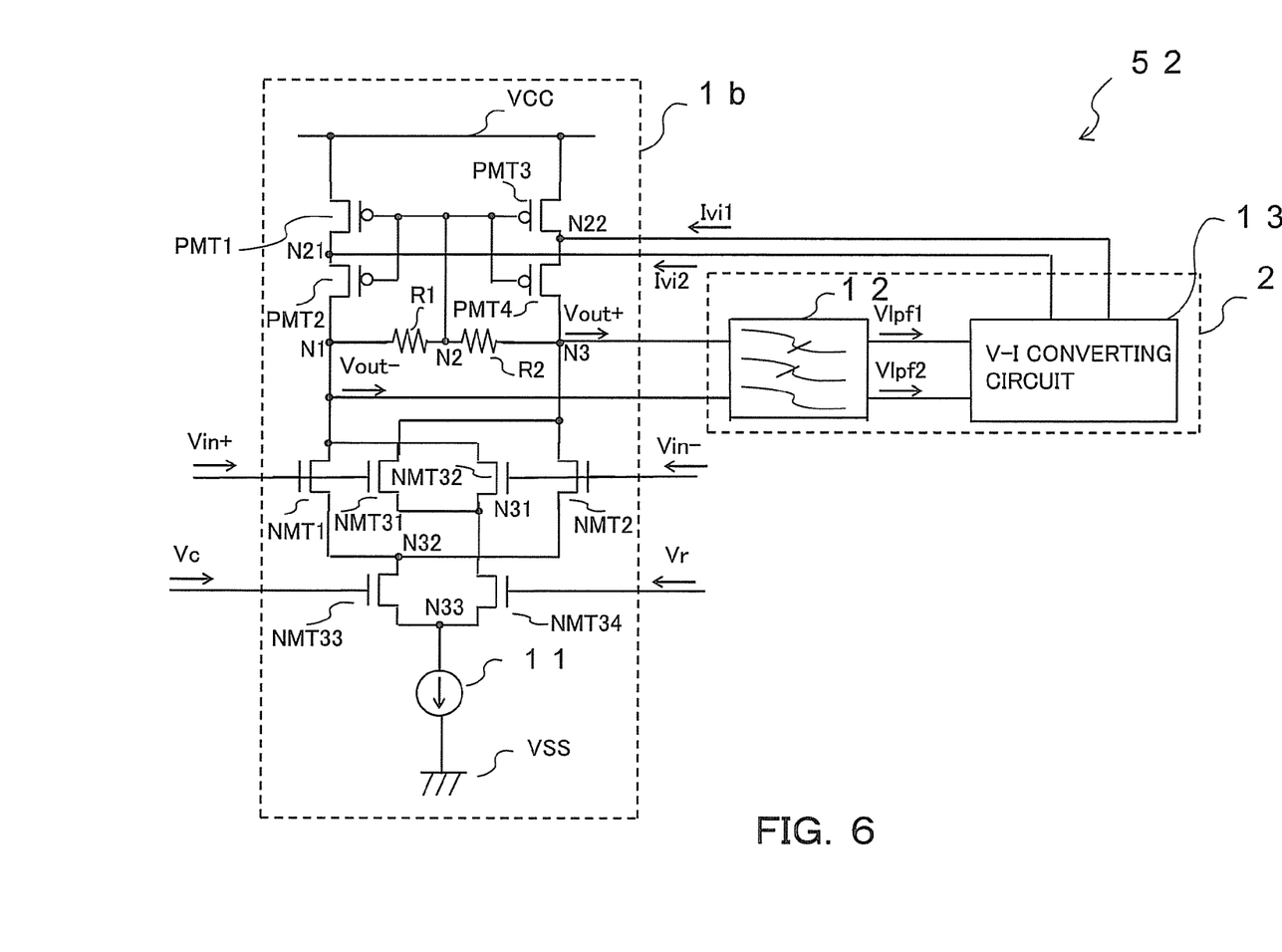
FIG. 6 is a circuit diagram showing a structure of a differential amplifier according to a third embodiment of the invention.

A differential amplifier according to a third embodiment of the invention will be described with reference to FIG. 6. FIG. 6 is a circuit diagram showing a structure of a differential amplifier.

The embodiment is different from the first embodiment in structure of a differential amplifier unit.

As shown in FIG. 6, a differential amplifier 52 is provided with a differential amplifier unit 1b and the feedback unit 2. In the differential amplifier 52, the DC offset, which is generated in the differential amplifier 1b, can be reduced because the currents Ivi1, Ivi2 are fed back from the voltage-to-current conversion circuit 13 of the feedback unit 2 to the differential amplifier unit 1b.

In the differential amplifier unit 1b, N-channel MOS transistors NMT31, NMT32, NMT33 and NMT34 are added to the first embodiment shown in FIG. 1.

A drain of the N-channel MOS transistor NMT31 is connected to the node N3. The plus side input voltage Vin+ is inputted to a gate of the N-channel MOS transistor NMT31. A source of the N-channel MOS transistor NMT31 is connected to a node N31.

A drain of the N-channel MOS transistor NMT32 is connected to the node N1. The minus side input voltage Vin− is inputted to a gate of the N-channel MOS transistor NMT32.

A source of the N-channel MOS transistor NMT32 is connected to the node N31. The N-channel MOS transistor NMT31 and the N-channel MOS transistor NMT32 compose a differential pair.

A drain of the N-channel MOS transistor NMT33 is connected to a node N32. A bias voltage Vc is inputted to a gate of the N-channel MOS transistor NMT33. A source of the N-channel MOS transistor NMT33 is connected to a node N33.

A drain of the N-channel MOS transistor NMT34 is connected to the node N31. A bias voltage Vr is inputted to a gate of the N-channel MOS transistor NMT34. A source of the N-channel MOS transistor NMT34 is connected to the node N33.

One end of the current source 11 is connected to the node N33. The other end of the current source 11 is connected to the lower potential power source VSS. The current source 11 flows a bias current from the node N33 to the lower potential power source VSS. The differential amplifier unit 1b operates by the bias current.

The differential amplifier unit 1b can vary currents which flow in the N-channel MOS transistors NMT1 and NMT2 composing the differential pair and in the N-channel MOS transistors NMT31 and NMT32 composing the differential pair by varying the bias voltages Vc and Vr, respectively. The differential amplifier 52 has a variable gain function.

According to the embodiment, in the differential amplifier 52, the nodes N1, N3 that are the output ports of the differential amplifier unit 1b and the nodes N21, N22 that are the output ports of the feedback unit 2 are separated. Thus, the DC offset voltage can be reduced, and the input and output impedance can be made large, and, in addition, the gain can be variable.

Figure 7:
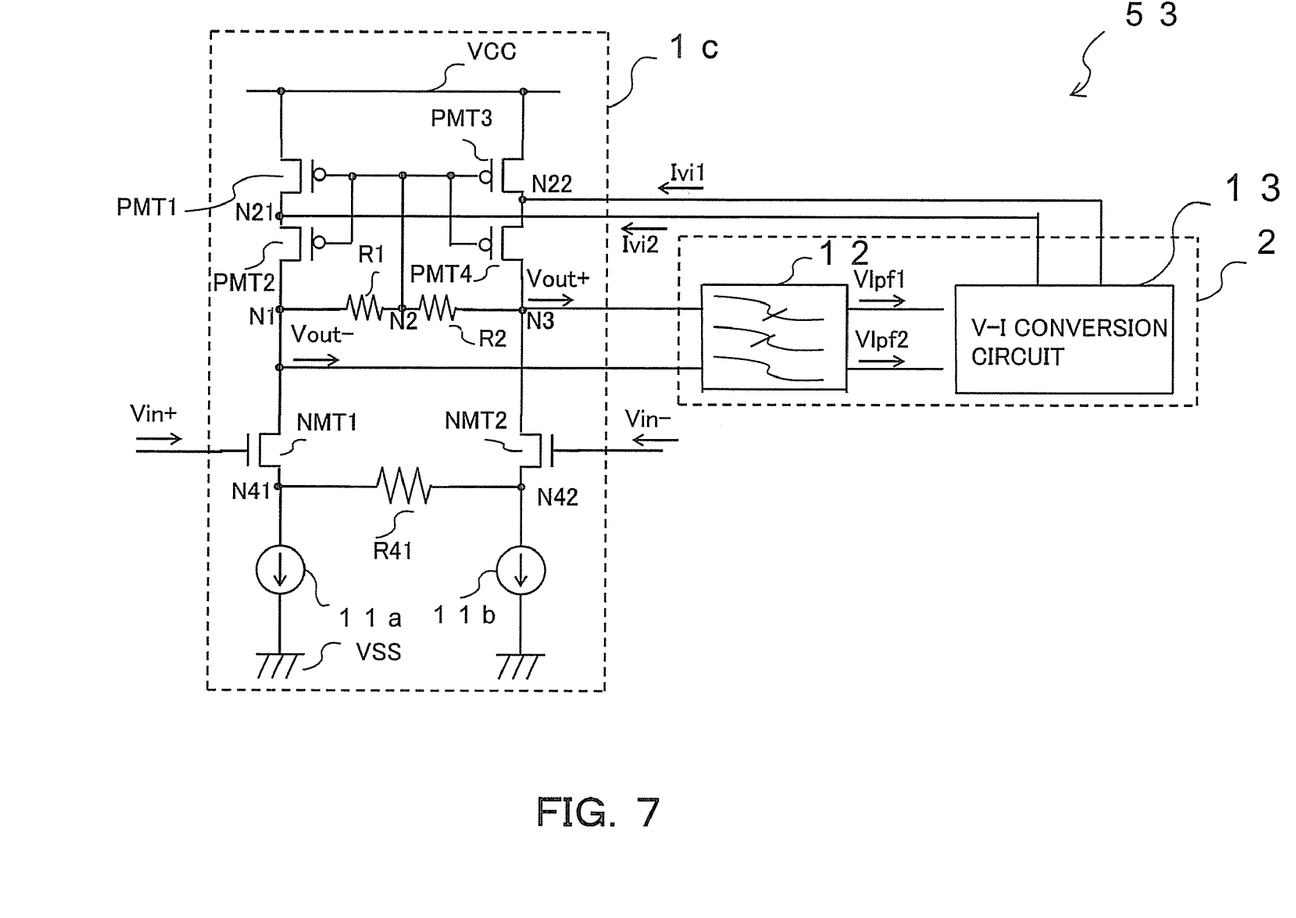
FIG. 7 is a circuit diagram showing a structure of a differential amplifier according to a fourth embodiment of the invention.

A differential amplifier according to a fourth embodiment of the invention will be described with reference to FIG. 7. FIG. 7 is a circuit diagram showing a structure of a differential amplifier.

The embodiment is different from the first embodiment in structure of a differential amplifier unit.

As shown in FIG. 7, a differential amplifier 53 is provided with a differential amplifier unit 1c and the feedback unit 2. In the differential amplifier 53, the DC offset, which is generated in the differential amplifier 1c, can be reduced because the currents Ivi1, Ivi2 are fed back from the voltage-to-current conversion circuit 13 of the feedback unit 2 to the differential amplifier unit 1c.

In the differential amplifier unit 1c according to the embodiment, in place of the current source 11 and the node N4 shown in FIG. 1, a current source 11a, a current source 11b, a resistor R41, and nodes N41, N42 are provided.

The source of the N-channel MOS transistor NMT1 is connected to the node N41. The source of the N-channel MOS transistor NMT2 is connected to the node N42.

The N-channel MOS transistor NMT1, NMT2 compose a differential pair.

One end of the resistor R41 is connected to the node N41. The other end of the resistor R41 is connected to the node N42. A resistance value of the resistor R41 is set so as to optimize the trans-conductance (gm) with respect to the input voltages Vin+, Vin− to be inputted to the gates of the N-channel MOS transistors NMT1, NMT2.

One end of the current source 11a is connected to the node N41. The other end of the current source 11a is connected to the lower potential power source VSS. One end of the current source 11b is connected to the node N42. The other end of the current source 11b is connected to the lower potential power source VSS. The current sources 11a and 11b flow bias currents to the lower potential power source VSS. The differential amplifier unit 1c operates by the bias currents.

As described above, in the differential amplifier according to the embodiment, the DC offset, which is generated in the differential amplifier unit 1c, can be reduced because the currents Ivi1, Ivi2 are fed back to the differential amplifier unit 1c.

In addition, the input and output impedance is large because the nodes N1, N3 that are the output ports of the differential amplifier unit 1c and the nodes N21, N22 that are the output ports of the feedback unit 2 are separated. The trans-conductance (gm) of the N-channel MOS transistors NMT1, NMT2 can be optimized because the resistor R41 is provided.

Figure 8:
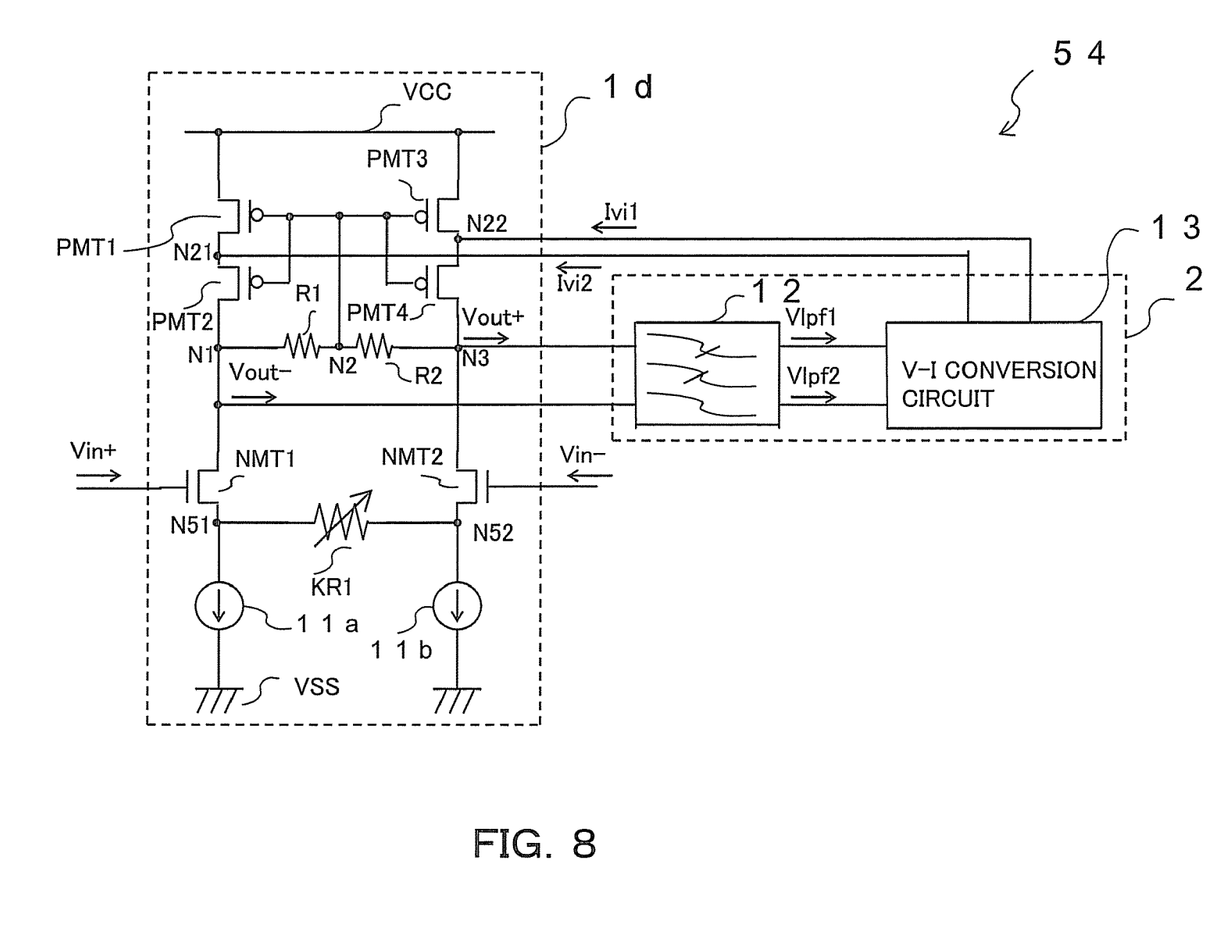
FIG. 8 is a circuit diagram showing a structure of a differential amplifier according to a fifth embodiment of the invention.

A differential amplifier according to a fifth embodiment of the invention will be described with reference to FIG. 8. FIG. 8 is a circuit diagram showing a structure of a differential amplifier.

As shown in FIG. 8, the embodiment uses a variable resistor KR1 in place of the resistor R41 of the fourth embodiment. The other structure of the embodiment is the same as the fourth embodiment.

A differential amplifier 54 is provided with a differential amplifier unit 1d and the feedback unit 2. The DC offset, which is generated in the differential amplifier unit 1d, can be reduced because the currents Ivi1, Ivi2 are fed back from the voltage-to-current conversion circuit 13 of the feedback unit 2 to the differential amplifier unit 1d.

One end of the variable resistor KR1 is connected to a node N51. The other end of the variable resistor KR1 is connected to a node N52.

The variable resistor KR1 is composed of a plurality of resistors and a plurality of switches, for example. At least one of the resistors is selected so as to vary a resistance value as a whole by operating the switches selectively.

The variable resistor KR1 varies the trans-conductance (gm) with respect to the input signals inputted to N-channel MOS transistors NMT, NMT2. Thus, the gain can be made variable. In addition, according to the differential amplifier 54 of the embodiment, the nodes N1, N3 that are the output ports of the differential amplifier unit 1d and the nodes N21, N22 that are the output ports of the feedback unit 2 are separated. Thus, the DC offset voltage can be reduced, and the input and output impedance is large.

Figure 9:
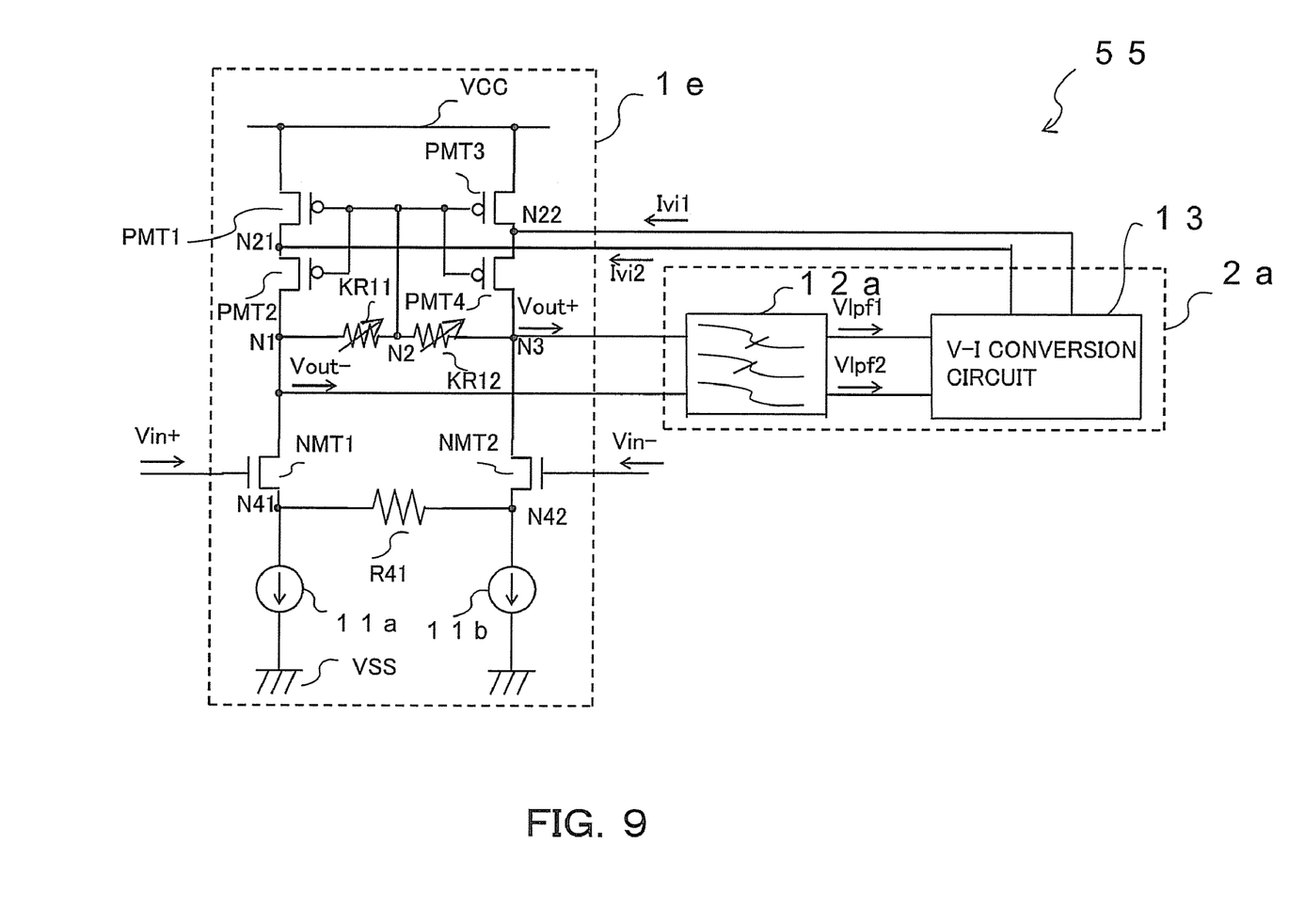
FIG. 9 is a circuit diagram showing a structure of a differential amplifier according to a sixth embodiment of the invention.

A differential amplifier according to a sixth embodiment of the invention will be described with reference to FIG. 9. FIG. 9 is a circuit diagram showing a structure of a differential amplifier.

As shown in FIG. 9, a differential amplifier 55 is provided with a differential amplifier unit 1e and the feedback unit 2. In the embodiment, variable resistors KR11, KR12 are used in place of the resistors R1, R2 of the differential amplifier unit 1c of the fourth embodiment. The other structure of the embodiment is the same as the fourth embodiment.

One end of the variable resistor KR11 is connected to the node N1. The other end of the variable resistor KR11 is connected to the node N2. One end of the variable resistor KR12 is connected to the node N2. The other end of the variable resistor KR12 is connected to the node N3.

The variable resistors KR11, KR12 vary the output resistance of the differential amplifier 55. Thus, the gain can be made variable. In addition, according to the differential amplifier 55 of the embodiment, the DC offset voltage can be reduced, and the input and output impedance is large.

In the above-described embodiments, the differential amplifiers are composed of MOS transistors or CMOSs as insulated gate field effect transistors. In place of the CMOSs, circuits of the differential amplifiers may be composed of bipolar transistors or BiCMOSs.

In the case of an insulated gate field effect transistor, a drain becomes a current input end, a source becomes a current output end, and a gate becomes a control end, for example. In the case of a bipolar transistor, a collector becomes a current input end, an emitter becomes a current output end, and a base becomes a control end, for example.

Other embodiments or modifications of the present invention will be apparent to those skilled in the art from consideration of the specification and practice of the invention disclosed herein. It is intended that the specification and example embodiments be considered as exemplary only, with a true scope and spirit of the invention being indicated by the followering.

What is claimed is:

1. A differential amplifier, comprising a differential amplifier unit and a feedback unit to supply a feedback current to the differential amplifier unit, the differential amplifier unit including:

first and second transistors composing a differential pair, each of the first and second transistors being provided with a current input end, a current output end connected to a lower potential power source and a control end, first and second loads which are cascade connected between a higher potential power source and the current input end of the first transistor, and third and fourth loads which are cascade connected between the higher potential power source and the current input end of the second transistor, wherein the feedback unit generates first and second feedback currents based on first and second output voltages obtained from a first node connecting the first transistor and the second load and a second node connecting the second transistor and the fourth load, and the feedback unit inputs the first and second feedback currents to a third node connecting the first and second loads and a fourth node connecting the third and fourth loads, respectively.

2. The differential amplifier as recited in claim 1, wherein a plus (+) side input voltage is inputted to the control end of the first transistor, a minus (−) side input voltage with an inverse phase of the plus (+) side input voltage is inputted to the control end of the second transistor, a minus (−) side output voltage is outputted from the first node, and a plus (+) side output voltage is outputted from the second node.

3. The differential amplifier as recited in claim 1, wherein the first and second loads are composed of third and fourth transistors which are cascode connected; and the third and fourth loads are composed of fifth and sixth transistors which are cascade connected.

4. The differential amplifier as recited in claim 3, further comprising first and second resistors, wherein an end of the first resistor is connected to the first node, an end of the second resistor is connected to the second node, and other terminals of the first and second resistors are connected to the control ends of the third, fourth, fifth and sixth transistors.

5. The differential amplifier as recited in claim 1, wherein each of the first, second, third and fourth loads is a normally-on transistor, a resistor or a transistor which is turned ON when a voltage is supplied to a gate.

6. A differential amplifier, comprising a differential amplifier unit and a feedback unit to supply a feedback current to the differential amplifier unit, the differential amplifier unit including:

first and second transistors composing a differential pair, each of the first and second transistors being provided with a source connected to a lower potential power source, a drain and a gate, a third transistor having a source connected to a higher potential power source, a fifth transistor having a source connected to the higher potential power source, a fourth transistor connected between a drain of the third transistor and the drain of the first transistor, a sixth transistor connected between a drain of the fifth transistor and the drain of the second transistor, a first resistor having two ends, one of the ends being connected to a first node connecting the first transistor and the fourth transistor and the other of the ends being connected to control ends of the third, fourth, fifth and sixth transistors, and a second resistor having two ends, one of the ends being connected to a second node connecting the second transistor and the sixth transistor and an other of the ends being connected to the control ends of the third, fourth, fifth and sixth transistors, wherein the feedback unit generates first and second feedback currents based on first and second output voltages obtained from the first and second nodes, and the feedback unit inputs the first and second feedback currents to a third node connecting the third and fourth transistors and a fourth node connecting the fifth and sixth transistors, respectively.

7. The differential amplifier as recited in claim 6, wherein a plus (+) side input voltage is inputted to the gate of the first transistor, a minus (−) side input voltage with an inverse phase of the plus (+) side input voltage is inputted to the gate of the second transistor, a minus (−) side output voltage is outputted from the first node, and a plus (+) side output voltage is outputted from the second node.

8. The differential amplifier as recited in claim 6, wherein the feedback unit includes a low pass filter to receive the output voltages from the first and second nodes, and a voltage-to-current conversion circuit to receive first and second outputs from the low pass filter and to generate the first and second feedback currents.

9. The differential amplifier as recited in claim 6, wherein the differential amplifier unit further comprises a seventh transistor, an eighth transistor, a ninth transistor and a tenth transistor, sources of the ninth and tenth transistors are connected to the lower potential power source, a drain of the seventh transistor is connected to the drain of the second transistor, a drain of the eighth transistor is connected to the drain of the first transistor, a gate of the ninth transistor is connected to a terminal to which a first bias voltage is applied, a drain of the ninth transistor is connected to the sources of the first and second transistors, a gate of the tenth transistor is connected to a terminal to which a second bias voltage is applied, and a drain of the tenth transistor is connected to sources of the seventh and eighth transistors, and wherein a gain is varied by varying the first and second bias voltages.

10. The differential amplifier as recited in claim 6, further comprising a third resistor, wherein an end of the third resistor is connected to the source of the first transistor, and the other end of the third resistor is connected to the source of the second transistor.

11. The differential amplifier as recited in claim 10, wherein the lower potential power source is composed of first and second lower potential power sources, and the first lower potential power source is connected to the source of the first transistor, and the second lower potential power source is connected to the source of the second transistor.

12. The differential amplifier as recited in claim 10, wherein a resistance value of the third resistor is variable.

13. The differential amplifier as recited in claim 6, wherein resistance values of the first and second resistors are variable.

14. The differential amplifier as recited in claim 10, wherein resistance values of the first and second resistors are variable.

15. A differential amplifier, comprising a differential amplifier unit and a feedback unit to supply a feedback current to the differential amplifier unit, the differential amplifier unit including:

first and second transistors composing a differential pair, each of the first and second transistors being provided with a source connected to a lower potential power source, a drain and a gate, a first resistor having an end connected to a higher potential power source, a second resistor having an end connected to the higher potential power source, a third transistor connected between the other end of the first resistor and the drain of the first transistor, a fourth transistor connected between the other end of the second resistor and the drain of the second transistor, a third resistor having two ends, one of the ends being connected to a first node connecting the first transistor and the third transistor and the other of the ends being connected to control ends of the third and fourth transistors, and a fourth resistor having two ends, one of the ends being connected to a second node connecting the second transistor and the fourth transistor and the other of the ends being connected to the control ends of the third and fourth transistors, wherein the feedback unit generates first and second feedback currents based on first and second output voltages obtained from the first and second nodes, and the feedback unit inputs the first and second feedback currents to a third node connecting the third transistor and the first resistor and a fourth node connecting the fourth transistor and the second resistor.

16. The differential amplifier as recited in claim 15, wherein a plus (+) side input voltage is inputted to the gate of the first transistor, a minus (−) side input voltage with an inverse phase of the plus (+) side input voltage is inputted to the gate of the second transistor, a minus (−) side output voltage is outputted from the first node, and a plus (+) side output voltage is outputted from the second node.

17. The differential amplifier as recited in claim 15, wherein the feedback unit includes:

a low pass filter to receive the output voltages from the first and second nodes; and a voltage-to-current conversion circuit to receive first and second outputs from the low pass filter and to generate the first and second feedback currents.

18. The differential amplifier as recited in claim 15, wherein the differential amplifier unit further comprises a fifth transistor, a sixth transistor, a seventh transistor and an eighth transistor, sources of the seventh and eighth transistors are connected to the lower potential power source, a drain of the fifth transistor is connected to the drain of the second transistor, a drain of the sixth transistor is connected to the drain of the first transistor, a gate of the seventh transistor is connected to a terminal to which a first bias voltage is applied, a drain of the seventh transistor is connected to the sources of the first and second transistors, a gate of the eighth transistor is connected to a terminal to which a second bias voltage is applied, and a drain of the eighth transistor is connected to the sources of the fifth and sixth transistors, and wherein a gain is varied by varying the first and second bias voltages.

19. The differential amplifier as recited in claim 15, further comprising a fifth resistor, wherein an end of the fifth resistor is connected to the source of the first transistor; and an other end of the fifth resistor is connected to the source of the second transistor.

20. The differential amplifier as recited in claim 15, wherein the lower potential power source is composed of first and second lower potential power sources, and the first lower potential power source is connected to the source of the first transistor, and the second lower potential power source is connected to the source of the second transistor.

* * * * *